(12) United States Patent
Wang et al.

(10) Patent No.: US 11,287,456 B2
(45) Date of Patent: Mar. 29, 2022

(54) CAPACITIVE COMPENSATED VOLTAGE SENSOR

(71) Applicant: S & C Electric Company, Chicago, IL (US)

(72) Inventors: Zitao Wang, Greenfield, WI (US); Brian P Mugalian, Chicago, IL (US); John Gorecki, Milwaukee, WI (US)

(73) Assignee: S&C Electric Company, Chicago, IL (US)

( * ) Notice: Subject to any disclaimer, the term of this patent is extended or adjusted under 35 U.S.C. 154(b) by 0 days.

(21) Appl. No.: 16/848,405

(22) Filed: Apr. 14, 2020

(65) Prior Publication Data

US 2020/0333385 A1  Oct. 22, 2020

Related U.S. Application Data

(60) Provisional application No. 62/835,085, filed on Apr. 17, 2019.

(51) Int. Cl.
*G01R 21/06* (2006.01)
*G01R 15/06* (2006.01)

(52) U.S. Cl.
CPC .......... *G01R 21/06* (2013.01); *G01R 15/06* (2013.01)

(58) Field of Classification Search
CPC ......... G01R 21/06; G01R 15/06; G01R 15/16
USPC ....................................................... 324/713
See application file for complete search history.

(56) References Cited

U.S. PATENT DOCUMENTS

| 5,550,469 | A | * | 8/1996 | Tanabe | G01R 33/06 324/225 |
| 7,592,820 | B2 | * | 9/2009 | Laakso | G01K 7/24 324/713 |
| 11,063,365 | B2 | * | 7/2021 | de Rochemont | H01Q 5/15 |
| 2001/0048308 | A1 | * | 12/2001 | Potter | G01R 15/16 324/519 |
| 2016/0154051 | A1 | * | 6/2016 | Watson | G01R 21/006 324/552 |
| 2017/0030946 | A1 | * | 2/2017 | Gravermann | G01R 19/0084 |
| 2018/0252749 | A1 | * | 9/2018 | Elliott | G01R 15/06 |
| 2020/0412164 | A1 | * | 12/2020 | Miller | H02J 7/00712 |

* cited by examiner

*Primary Examiner* — Tung X Nguyen
*Assistant Examiner* — Robert P Alejnikov, Jr.

(57) ABSTRACT

A capacitive voltage sensor for estimating voltage on a power line. The sensor includes a dielectric bushing surrounding the line, and an annular conductor formed in the bushing and being capacitively coupled to the line, where a first capacitance is defined between the line and the annular conductor and a second capacitance is defined between the annular conductor and ground. The sensor also includes a capacitance compensation circuit having an amplifier including a first terminal electrical coupled to the annular conductor, and first and second capacitance compensation capacitors electrically coupled to the terminals of the amplifier, where the compensation capacitors are made of different materials having different dielectric constants, and where the materials of the compensation capacitors are selected so as to compensate for changes in the first and second capacitances in response to temperature changes. Also, a thermistor is provided in a resistor compensation circuit to provide resistance compensation.

20 Claims, 2 Drawing Sheets

CAPACITIVE COMPENSATED VOLTAGE SENSOR

CROSS-REFERENCE TO RELATED APPLICATION

This application claims the benefit of priority from the U.S. Provisional Application No. 62/835,085, filed on Apr. 17, 2019, the disclosure of which is hereby expressly incorporated herein by reference for all purposes.

BACKGROUND

Field

This disclosure relates generally to a voltage sensor and, more particularly, this disclosure relates to a capacitive voltage sensor including capacitance compensation.

Discussion of the Related Art

An electrical power distribution network, often referred to as an electrical grid, typically includes a number of power generation plants each having a number of power generators, such as gas turbines, nuclear reactors, coal-fired generators, hydro-electric dams, etc. The power plants provide power at a variety of medium voltages that are then stepped up by transformers to a high voltage AC signal to be connected to high voltage transmission lines that deliver electrical power to a number of substations typically located within a community, where the voltage is stepped down to a medium voltage for distribution. The substations provide the medium voltage power to a number of three-phase feeder lines. The feeder lines are coupled to a number of lateral lines that provide the medium voltage to various distribution transformers, where the voltage is stepped down to a low voltage and is provided to a number of loads, such as homes, businesses, etc.

Power distribution networks of the type referred to above include a number of switching devices, breakers, reclosers, interrupters, etc. that control the flow of power throughout the network. Some of these components are enclosed in a number of external housings that are mounted on, for example, a concrete pad, or mounted underground, and are generally referred to herein as switchgear. The number and type of switchgear are application specific to the particular power network.

Voltage sensors are often employed in these types of switchgear. For example, it is known to employ a voltage sensor on a source side of the switch in a switchgear and on a load side of the switch so as to provide pulse closing control of the switch for clearing faults. Some of these switches, such as vacuum fault interrupter switches, employ solid insulation housings, where it is known to mold voltage sensor electrodes in the housing at a location close to a grounded surface. These types of voltage sensors operate as a capacitive voltage divider, where the same insulation material is used for both the high and low voltage capacitor layers in order to achieve good accuracy over a specified range of operating temperatures. These types of voltage sensors often employ a dielectric bushing formed around a high voltage conductor and an embedded screen within the bushing. However, because of the relationship between the bushing material and environmental temperature it is difficult to maintain the accuracy of the measured voltage to meet the desired standards even when compensation techniques are employed.

SUMMARY

The following discussion discloses and describes a capacitive voltage sensor that has particular application for estimating the AC phase—neutral voltage on a high voltage line. The voltage sensor includes a dielectric bushing surrounding the line, and an annular conductor formed in the bushing and being capacitively coupled to the line, where a first capacitance is defined between the line and the annular conductor and a second capacitance is defined between the annular conductor and ground. The voltage sensor also includes a capacitor compensation circuit having an instrumentation amplifier including a first terminal electrical coupled to the annular conductor, and first and second compensation capacitors electrically coupled to the first terminal and a second terminal of the instrumentation amplifier, where the first and second compensation capacitors are made of different materials having different dielectric constants, and where the materials of the first and second compensation capacitors are selected so as to compensate for changes in the first and second capacitances in response to temperature changes. The voltage sensor further includes a resistor compensation circuit having an operational amplifier including a first terminal and a second terminal and operating as a voltage series feedback circuit, where the first terminal of the operational amplifier is electrically connected to an output of the instrumentation amplifier. The resistor compensation circuit includes a first pair of a resistor and a thermistor and a second pair of a resistor and a thermistor, where the thermistors in the first and second pairs change their resistance in response to the changes in temperature so as to provide resistance compensation.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a capacitive voltage sensor including first and second capacitance compensation capacitors that are made of different materials having different dielectric constants, where the materials are selected so as to compensate for changes of the capacitance of a bushing surrounding a conductor in response to temperature changes, and where a thermistor is provided in a resistor compensation circuit to provide resistance compensation, is merely exemplary in nature, and is in no way intended to limit the invention or its applications or uses. For example, the discussion herein describes a capacitive voltage sensor for sensing high voltage on a line in switchgear. However, the voltage sensor may have other voltage sensing applications.

Figure 1:
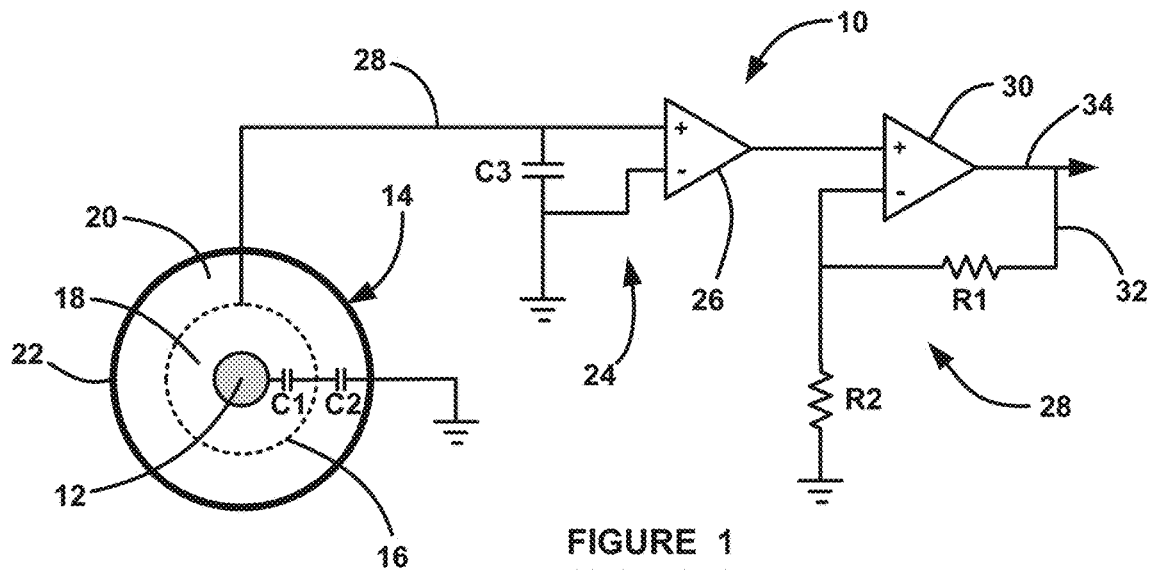
FIG. 1 is a schematic type diagram of a known capacitive voltage sensor.

FIG. 1 is a schematic type illustration of a known capacitive voltage sensor 10 for measuring the AC phase—neutral voltage $V_{PN}$ on a high-voltage conductor 12, such as a power line in a switchgear. The sensor 10 includes a bushing 14 that surrounds the conductor 12 and is concentric therewith, where the bushing 14 is made of a suitable dielectric or insulating material for high voltage applications, such as Cypoxy®, and where the bushing 14 and the conductor 12 are illustrated in cross-section. An annular capacitive screen 16 is formed in the bushing 14 some distance from the conductor 12 to define an inner bushing portion 18 and an outer bushing portion 20, where a capacitance shown as a capacitor C1 is defined across the inner bushing portion 18 between the conductor 12 and the screen 16 and a capacitance shown as a capacitor C2 is defined across the outer bushing portion 20 between the screen 16 and a ground plane 22, which in this example is a thin conductive coating on the outside of the bushing 14, and where the capacitance of the capacitors C1 and C2 are set by the dielectric constant c of the bushing material. The capacitive coupling between the conductor 12 and the screen 16 and between the screen 16 and the ground plane 22 can be used to provide a voltage estimate of the AC phase—neutral voltage $V_{PN}$ on the conductor 12 in a manner well understood by those skilled in the art.

The sensor 10 includes a capacitor compensation circuit 24 having an instrumentation or differential amplifier 26, where a positive input terminal of the amplifier 26 is electrical coupled to the screen 16 on line 28 and a negative input terminal of the amplifier 26 is coupled to ground. The compensation circuit 24 also includes a compensation capacitor C3 electrically coupled across the input terminals of the amplifier 26 that compensates for capacitance changes of the capacitors C1 and C2 as discussed herein. The amplifier 26 amplifies the detected voltage on the screen 16 and provides the amplified voltage to a positive input terminal of an operational amplifier 30 having a series feedback circuit, a resistor R1 provided in a feedback line 32 from the output of the amplifier 30 to the negative input terminal of the amplifier 30, and a resistor R2 provide between the negative terminal of the amplifier 30 and ground, where the resistors R1 and R2 provide voltage regulation for the amplification provided by the amplifier 30. The output of the amplifier 30 provided on line 34 is a measured voltage $V_{sensing}$ that is a proportional estimate of the AC phase—neutral voltage $V_{PN}$ on the conductor 12, and can be determined as:

$$V_{C3} = \frac{C1}{C1 + C2 + C3} V_{PN}, \quad (1)$$

$$V_{sensing} = \left(1 + \frac{R1}{R2}\right) V_{C3}, \quad (2)$$

where $V_{C3}$ is the voltage at the positive input terminal of the amplifier 28 on the line 26. Because C3>>C1+C2, equation (1) can be written as:

$$V_{C3} \approx \frac{C1}{C3} V_{PN}. \quad (3)$$

A general expression for capacitance C can be defined as:

$$C = \varepsilon \frac{S}{L}, \quad (4)$$

where ε is the dielectric constant of the capacitor material, S is the area of the capacitor plates and L is the spacing between the capacitor plates.

The capacitor C3 is coupled across the input terminals of the amplifier 26 to correct the relationship between the voltage on the screen 16 relative to the phase—neutral voltage $V_{PN}$ on the conductor 12 that is altered by the capacitances of the capacitors C1 and C2. As the temperature of the bushing 14 changes its dielectric constant ε also changes, which changes the capacitances of the capacitors C1 and C2. Therefore, in order to obtain an accurate measurement of the voltage on the conductor 12 by the sensor 10 it is desirable that the capacitor C3 includes a material having a dielectric constants c that changes the capacitance of the capacitor C3 in response to the same temperature changes in the same manner as the capacitors C1 and C2 so that the measured voltage can be used to directly estimate the phase-neutral voltage $V_{PN}$. However, providing such a capacitor is difficult in practice.

Figure 2:
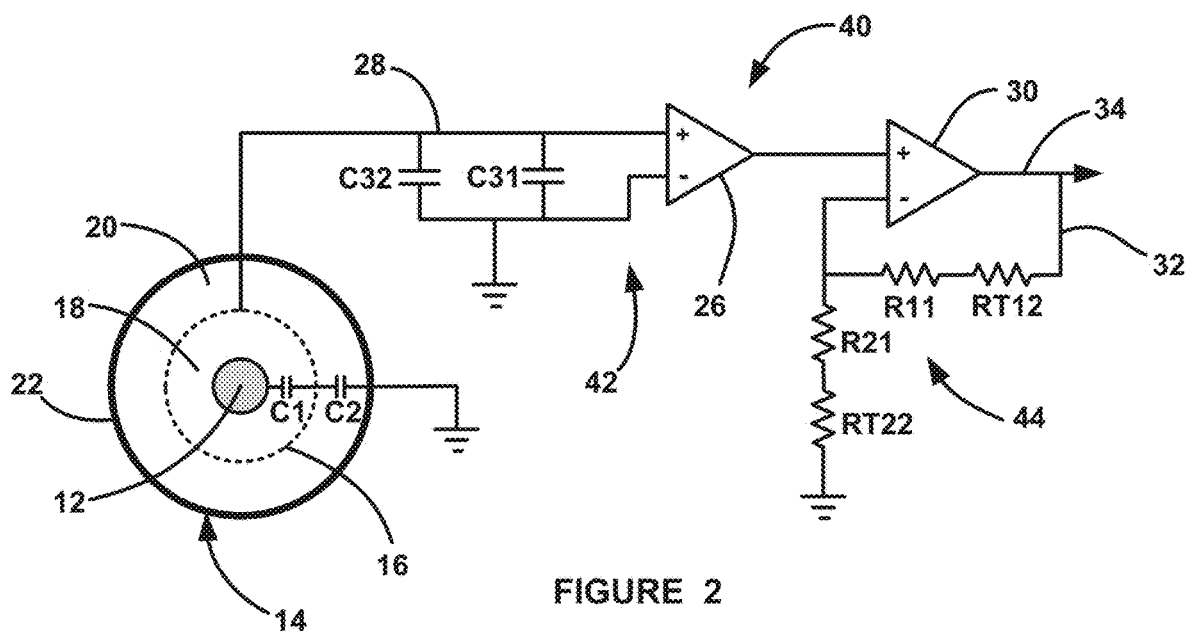
FIG. 2 is a schematic type diagram of a capacitive voltage sensor including a capacitor compensation circuit having two capacitors electrically coupled in parallel and a resistor compensation circuit having two resistor and thermistor pairs.

FIG. 2 is a schematic type illustration of a capacitive voltage sensor 40 that provides improved capacitance compensation in response to temperature changes over the sensor 10, where like elements are identified by the same reference number. Particularly, the compensation circuit 24 has been replaced with a capacitor compensation circuit 42, where the compensation capacitor C3 has been replaced with two capacitors C31 and C32 electrically coupled in parallel that combine to provide the desired capacitive compensation for the changes in the dielectric constant c of the bushing 14 in response to temperature changes, where the capacitors C31 and C32 are made of different materials having different dielectric constants E.

The following analysis shows how separating the capacitor C3 into the two capacitors C31 and C32 having different materials can be employed to compensate for changes in the capacitance of the capacitors C1 and C2 in response to temperature changes of the bushing 14. First, the capacitance of the capacitors C1, C31 and C32 are linearized for a certain temperature, where that temperature is 25° C. in this non-limiting example, as:

$$C1 = C1_{25}(1 + A_{C1}(T-25)), \quad (5)$$

$$C31 = C31_{25}(1 + A_{C31}(T-25)), \quad (6)$$

$$C32 = C32_{25}(1 + A_{C32}(T-25)), \quad (7)$$

where A is a temperature coefficient of capacitance and T is the temperature of the sensor 40.

When $A_{C31} > A_{C1}$ and $A_{C32} < A_{C1}$ or $A_{C31} < A_{C1}$ and $A_{C32} > A_{C1}$, temperature compensation can be provided. From equation (3):

$$\frac{C1}{C3} = \frac{C1_{25}(1 + A_{C1}(T-25))}{C31_{25}(1 + A_{31}(T-25)) + C32_{25}(1 + A_{32}(T-25))} = \text{constant.} \quad (8)$$

From equation (8), the best capacitance compensation can be obtained by:

$$C31_{25} \times A_{C31} + C32_{25} \times A_{C32} = C3_{25} \times A_{C1}. \tag{10}$$

Therefore, by solving equations (9) and (10), the materials for the capacitors C31 and C32 can be selected using the coefficient $A_{C3}$ to provide the desired compensation in response to temperature changes, where $A_{C3}$ can be identified as:

$$A_{C3} = \frac{C31_{25} \times A_{C31} + C32_{25} \times A_{C32}}{C31_{25} + C32_{25}}. \tag{11}$$

Figure 3:
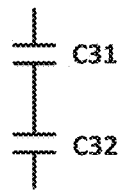
FIG. 3 is a schematic diagram of two capacitors electrically coupled in series that can replace the two capacitors electrically coupled in parallel in the capacitor compensation circuit shown in FIG. 2.

Although this embodiment shows the capacitors C31 and C32 being electrically connected in parallel, the capacitance compensation can also be provided by electrically connecting the capacitors C31 and C32 in series across the input terminals of the amplifier 26, as shown by FIG. 3.

By separating the capacitor C3 into the two capacitors C31 and C32 as discussed above, the accuracy of the voltage sensing can be increased. However, in some situations, that accuracy may still not be sufficient for certain applications. Therefore, the present disclosure also provides additional temperature compensation by providing a variable resistor, such as a thermistor, in the voltage series feedback circuit 28 whose resistance changes linearly with temperature changes, where the feedback circuit is now defined as resistor compensation circuit 44. Particularly, in this non-limiting embodiment, the resistor R1 is replaced with a resistor R11 and a thermistor RT12 provided in electrical series and the resistor R2 is replaced with a resistor R21 and a thermistor RT22 provided in electrical series, where the thermistors RT12 and RT22 can be any thermistor that linearly changes its resistance in response to temperature changes suitable for the purposes discussed herein. In one non-limiting example, the thermistors RT12 and RT22 are nickel thin film linear thermistors. The combination of the resistor R11 and the thermistor RT12 provides positive resistor compensation and the combination of the resistor R21 and the thermistor RT22 provide negative resistor compensation. In an alternate embodiment, the resistor R11 and the thermistor RT12 can be electrically coupled in parallel and the resistor R21 and the thermistor RT22 can be electrically coupled in parallel.

The total resistance $R_T$ of the resistor compensation circuit 44 can be linearized in the same way as the capacitance of the capacitor C1 in equation (5) as:

$$R_T = R_{25}(1 + B(T - 25)), \tag{12}$$

where B is a temperature coefficient of thermistor resistance.

For the series connected resistor R11 and the thermistor R12, the positive compensation of the resistance for the resistor R1 can be linearized using equation (12) as:

$$\begin{aligned} R1 &= R11 + RT12 \\ &= R11 + RT12_{25} \times [1 + B(T - 25)] \\ &= R11 + RT12_{25} + RT12_{25} \times B(T - 25) \\ &= (R11 + RT12_{25}) \times \left[1 + \frac{RT12_{25}}{R11 + RT12_{25}} \times B(T - 25)\right]. \end{aligned} \tag{13}$$

From equation (2), the measured voltage $V_{sensing}$ for the positive resistor compensation can then be obtained as:

$$\begin{aligned} V_{sensing} &= \left\{1 + \frac{R1}{R2}\right\} V_{C3} \\ &= \left\{1 + \frac{R11 + RT12_{25}}{R2} \times \left[1 + \frac{RT12_{25}}{R11 + RT12_{25}} \times B(T - 25)\right]\right\} V_{C3} \\ &= \left\{1 + \frac{R11 + RT12_{25}}{R2} + \frac{RT12_{25}}{R2} \times B(T - 25)\right\} V_{C3} \\ &= \left\{\frac{R2 + R11 + RT12_{25}}{R2} + \frac{RT12_{25}}{R2} \times B(T - 25)\right\} V_{C3} \\ &= \frac{R2 + R11 + RT12_{25}}{R2} \times \left[1 + \frac{RT12_{25}}{(R2 + R11 + RT12_{25})} \times B(T - 25)\right] \\ &= \left(1 + \frac{R11 + RT12_{25}}{R2}\right)\left[1 + \frac{RT12_{25}}{R2 + R11 + RT12_{25}} \times B(T - 25)\right] V_{C3}. \end{aligned} \tag{14}$$

The total resistor compensation coefficient $B_{new}$ for the positive resistor compensation is then:

$$B_{new} = \frac{RT12_{25}}{(R2 + R11 + RT12_{25})} \times B, \quad (15)$$

where $B_{new}$ is then used to set the resistance of the thermistor RT12.

For the series connected resistor R21 and the thermistor R22, the negative resistor compensation of the resistance for the resistor R2 can be linearized using equation (12) as:

$$V_{sensing} = \left(1 + \frac{R1}{R2}\right) V_{C3}$$

$$R2 = R21 + RT22 \quad (16)$$
$$= R21 + RT22_{25} \times [1 + B(T - 25)]$$
$$= R21 + RT22_{25} + RT22_{25} \times B(T - 25)$$
$$= (R21 + RT22_{25}) \times \left[1 + \frac{RT22_{25}}{R21 + RT22_{25}} \times B(T - 25)\right].$$

From equation (2), the measured voltage $V_{sensing}$ for the negative resistor compensation can then be obtained as:

$$\quad (17)$$

$$= \left\{1 + \frac{R1}{(R21 + RT22_{25}) \times \left[1 + \frac{RT22_{25}}{R21 + RT22_{25}} \times B(T - 25)\right]}\right\} V_{C3}$$

$$\approx \left\{1 + \frac{R1}{R21 + RT22_{25}} \times \left[1 - \frac{RT22_{25}}{R21 + RT22_{25}} \times B(T - 25)\right]\right\} V_{C3}$$

$$\approx \left\{1 + \frac{R1}{R21 + RT22_{25}} + \left[-\frac{R1 \times RT22_{25}}{(R21 + RT22_{25})^2} \times B(T - 25)\right]\right\} V_{C3}$$

$$\approx \left\{\frac{R1 + R21 + RT22_{25}}{R21 + RT22_{25}} - \frac{R1 \times RT22_{25}}{(R21 + RT22_{25})^2} \times B(T - 25)\right\} V_{C3}$$

$$\approx \frac{R1 + R21 + RT22_{25}}{R21 + RT22_{25}} \left\{1 - \frac{R1 \times RT22_{25}}{(R1 + R21 + RT22_{25}) \times (R21 + RT22_{25})} \times B(T - 25)\right\} V_{C3}.$$

Equation (17) is based on $$\varepsilon = \left(\frac{RT22_{25}}{R21 + RT22_{25}} \times B(T - 25)\right)^2 \ll 1,$$

and therefore the measured voltage $V_{sensing}$ for the negative resistor compensation is:

$$V_{sensing} = \quad (18)$$

$$\left(1 + \frac{R1}{R21 + RT22_{25}}\right)\left[1 - \frac{R1 \times RT22_{25}}{(R1 + R21 + RT22_{25}) \times (R21 + RT22_{25})} \times B(T - 25)\right] V_{C3}.$$

The total negative resistor compensation coefficient $B_{new}$ is then:

$$B_{new} = -\frac{R1 \times RT22_{25}}{(R1 + R21 + RT22_{25}) \times (R21 + RT22_{25})} \times B, \quad (19)$$

where $B_{new}$ is then used to set the resistance of the thermistor RT22.

The measured voltage $V_{sensing}$ for the combined capacitance and resistor compensation is then:

$$V_{sensing} = \left(1 + \frac{R1}{R2}\right)[1 + B_{new}(T-25)]V_{C3} \quad (20)$$

$$= \left(1 + \frac{R1}{R2}\right)[1 + B_{new}(T-25)] \times \frac{C1_{25}[1 + A_{C1}(T-25)]}{C3_{25}[1 + A_{C3}(T-25)]} \times V_{PN}$$

$$[1 + B_{new}(T-25)] \times \frac{[1 + A_{C1}(T-25)]}{[1 + A_{C3}(T-25)]} \approx 1$$

The relationship to compensate the coefficient $A_{C1}$ for the bushing 14 for both the capacitance compensation coefficient $A_{C3}$ and the resistor compensation coefficient $B_{new}$ is:

$$A_{C1} \approx A_{C3} - B_{new}. \quad (21)$$

Figure 4:
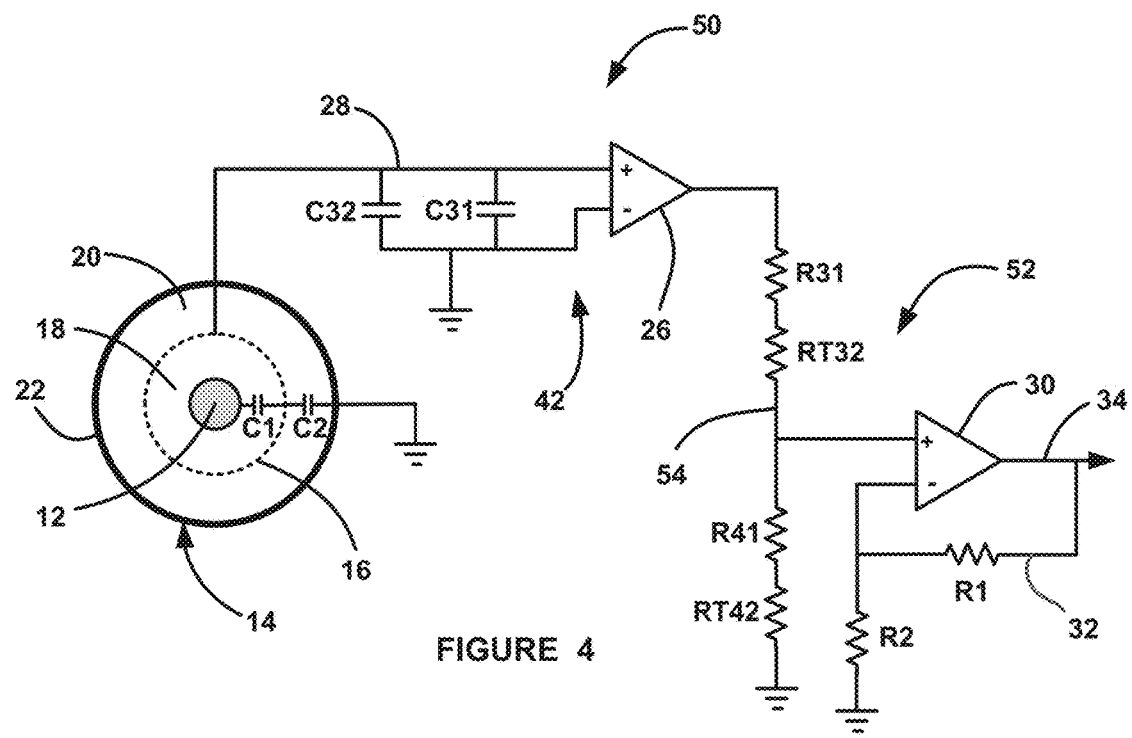
FIG. 4 is a schematic type diagram of a capacitive voltage sensor including the capacitor compensation circuit shown in FIG. 2 and another resistor compensation circuit having two resistor and thermistor pairs.

FIG. 4 is a schematic type diagram of a capacitive voltage sensor 50 that includes the capacitance compensation circuit 42, but includes a different resistor compensation circuit 52, where like elements to the sensor 40 are identified by the same reference number. Particularly, the compensation circuit 52 includes a line 54 between the output of the amplifier 26 and the positive input terminal of the amplifier 30 that includes series connected resistor R31 and thermistor RT32 that provide the negative resistor compensation and series connected resistor R41 and thermistor RT42 that provide the positive resistor compensation in the manner discussed above.

Figure 5:
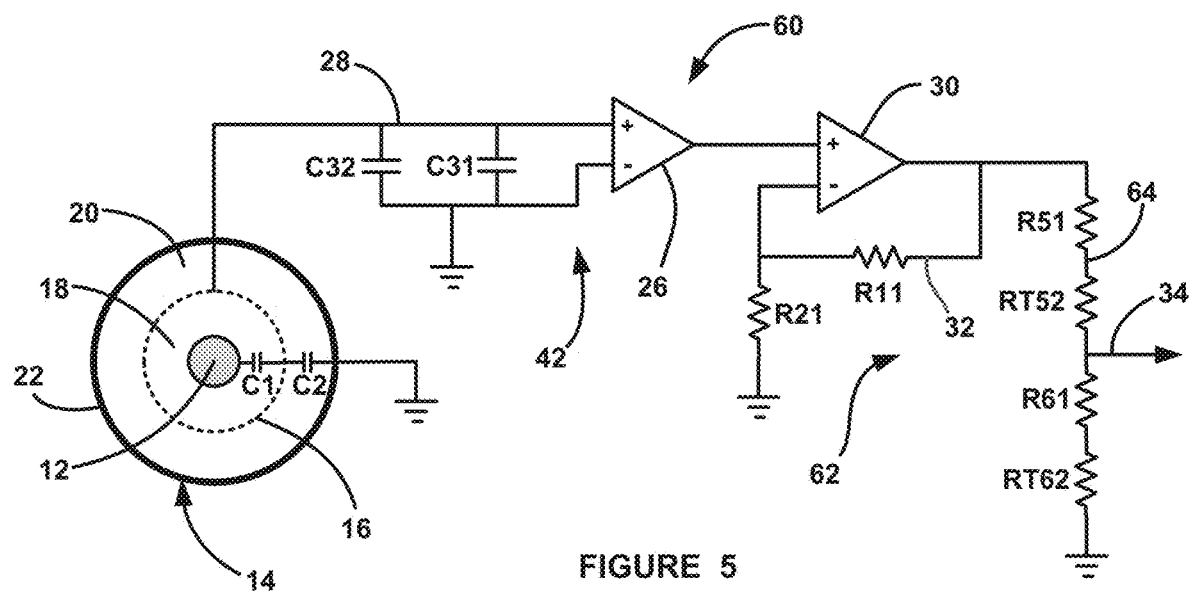
FIG. 5 is a schematic type diagram of a capacitive voltage sensor including the capacitor compensation circuit shown in FIG. 2 and another resistor compensation circuit having two resistor and thermistor pairs.

FIG. 5 is a schematic type diagram of a capacitive voltage sensor 60 that includes the capacitance compensation circuit 42, but includes a different resistor compensation circuit 62, where like elements to the sensor 40 are identified by the same reference number. Particularly, the compensation circuit 62 includes a line 64 between the output of the amplifier 30 and the line 34 that includes series connected resistor R51 and thermistor RT52 that provide the negative resistor compensation and series connected resistor R61 and thermistor RT62 that provide the positive resistor compensation in the manner discussed above.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A capacitive voltage sensor comprising:
   a cylindrical center conductor;
   a dielectric bushing surrounding the center conductor;
   an annular conductor formed in the bushing and being capacitively coupled to the center conductor, wherein a first capacitance is defined between the center conductor and the annular conductor and a second capacitance is defined between the annular conductor and ground; and
   a capacitance compensation circuit including an instrumentation amplifier having a first terminal electrical coupled to the annular conductor, and first and second capacitance compensation capacitors electrically coupled to the first terminal and a second terminal of the instrumentation amplifier, wherein the first and second compensation capacitors are made of different materials having different dielectric constants, and wherein the materials of the first and second compensation capacitors are selected so as to compensate for changes in the first and second capacitances in response to temperature changes.

2. The sensor according to claim 1 wherein the first and second compensation capacitors are electrically coupled in series.

3. The sensor according to claim 1 wherein the first and second compensation capacitors are electrically coupled in parallel.

4. The sensor according to claim 1 further comprising a resistor compensation circuit including an operational amplifier having first terminal and a second terminal, said first terminal of the operational amplifier being electrically coupled to an output of the instrumentation amplifier, said resistor compensation circuit including a first pair of a resistor and a thermistor and a second pair of a resistor and a thermistor, wherein the thermistors in the first and second pairs change resistance in response to the changes in temperature so as to provide resistance compensation, and wherein an output of the operational amplifier is an estimate of the voltage on the center conductor.

5. The sensor according to claim 4 wherein the first and second pairs of resistors and thermistors are electrically coupled in series.

6. The sensor according to claim 4 wherein the first and second pairs of resistors and thermistors are electrically coupled in parallel.

7. The sensor according to claim 4 wherein the first pair of a resistor and a thermistor is electrically coupled to an output of the operational amplifier and the second terminal of the operational amplifier and the second pair of a resistor and a thermistor is electrically coupled to the second terminal of the operational amplifier and ground.

8. The sensor according to claim 4 wherein the first pair of a resistor and a thermistor and the second pair of a resistor and a thermistor are both electrically coupled to a line coupled to the output of the instrumentation amplifier, the first terminal of the operational amplifier and ground.

9. The sensor according to claim 4 wherein the first pair of a resistor and a thermistor and the second pair of a resistor and a thermistor are both electrically coupled to a line coupled to the output of the operational amplifier and ground.

10. The sensor according to claim 4 wherein the first pair of a resistor and a thermistor provides positive resistor compensation and the second pair of a resistor and a thermistor provides negative resistor compensation.

11. The sensor according to claim 1 wherein the annular conductor is an annular screen.

12. The sensor according to claim 1 wherein the center conductor is a high voltage line in switchgear.

13. A capacitive voltage sensor comprising:
    a cylindrical center conductor;
    a dielectric bushing surrounding the center conductor;
    an annular conductor formed in the bushing and being capacitively couple to the center conductor;

an instrumentation amplifier having a first terminal electrical coupled to the annular conductor, said instrumentation amplifier outputting an amplified voltage on the annular conductor; and a resistor compensation circuit including an operational amplifier having first terminal and a second terminal, said first terminal of the operational amplifier being electrically coupled to the output of the instrumentation amplifier, said resistor compensation circuit including a first pair of a resistor and a thermistor and a second pair of a resistor and a thermistor, wherein the thermistors in the first and second pairs change resistance in response to the changes in temperature so as to provide resistance compensation, and wherein an output of the operational amplifier is an estimate of the voltage on the center conductor.

14. The sensor according to claim 13 wherein the first and second pairs of resistors and thermistors are electrically coupled in series.

15. The sensor according to claim 13 wherein the first and second pairs of resistors and thermistors are electrically coupled in parallel.

16. The sensor according to claim 13 wherein the first pair of a resistor and a thermistor is electrically coupled to an output of the operational amplifier and the second terminal of the operational amplifier and the second pair of a resistor and a thermistor is electrically coupled to the second terminal of the operational amplifier and ground.

17. The sensor according to claim 13 wherein the first pair of a resistor and a thermistor and the second pair of a resistor and a thermistor are both electrically coupled to a line coupled to the output of the instrumentation amplifier, the first terminal of the operational amplifier and ground.

18. The sensor according to claim 13 wherein the first pair of a resistor and a thermistor and the second pair of a resistor and a thermistor are both electrically coupled to a line coupled to the output of the operational amplifier and ground.

19. The sensor according to claim 13 wherein the first pair of a resistor and a thermistor provides positive resistor compensation and the second pair of a resistor and a thermistor provides negative resistor compensation.

20. A capacitive voltage sensor comprising:

a cylindrical center conductor;

a dielectric bushing surrounding the center conductor;

an annular conductor formed in the bushing and being capacitively coupled to the center conductor, wherein a first capacitance is defined between the center conductor and the annular conductor and a second capacitance is defined between the annular conductor and ground;

a capacitance compensation circuit including an instrumentation amplifier having a first terminal electrical coupled to the annular conductor, and first and second capacitance compensation capacitors electrically coupled to the first terminal and a second terminal of the instrumentation amplifier, wherein the first and second compensation capacitors are made of different materials having different dielectric constants, and wherein the materials of the first and second compensation capacitors are selected so as to compensate for changes in the first and second capacitances in response to temperature changes; and a resistor compensation circuit including an operational amplifier having first terminal and a second terminal, said first terminal of the operational amplifier being electrically coupled to an output of the instrumentation amplifier, said resistor compensation circuit including a first pair of a resistor and a thermistor and a second pair of a resistor and a thermistor, wherein the thermistors in the first and second pairs change resistance in response to the changes in temperature so as to provide resistance compensation where the first pair of a resistor and a thermistor provides positive resistor compensation and the second pair of a resistor and a thermistor provides negative resistor compensation, and wherein an output of the operational amplifier is an estimate of the voltage on the center conductor.

* * * * *